SELF-BIASING SEMI-CONDUCTOR AMPLIFIER CIRCUITS AND THE LIKE

Filed Nov. 15, 1952

INVENTOR.
Loy E. Barton

BY H. R. Newton

ATTORNEY

United States Patent Office 2,761,916

Patented Sept. 4, 1956

2,761,916

SELF-BIASING SEMI-CONDUCTOR AMPLIFIER CIRCUITS AND THE LIKE

Loy E. Barton, Princeton, N. J., assignor to Radio Corporation of America, a corporation of Delaware Application November 15, 1952, Serial No. 320,666

9 Claims. (Cl. 179—171)

Figure 1:
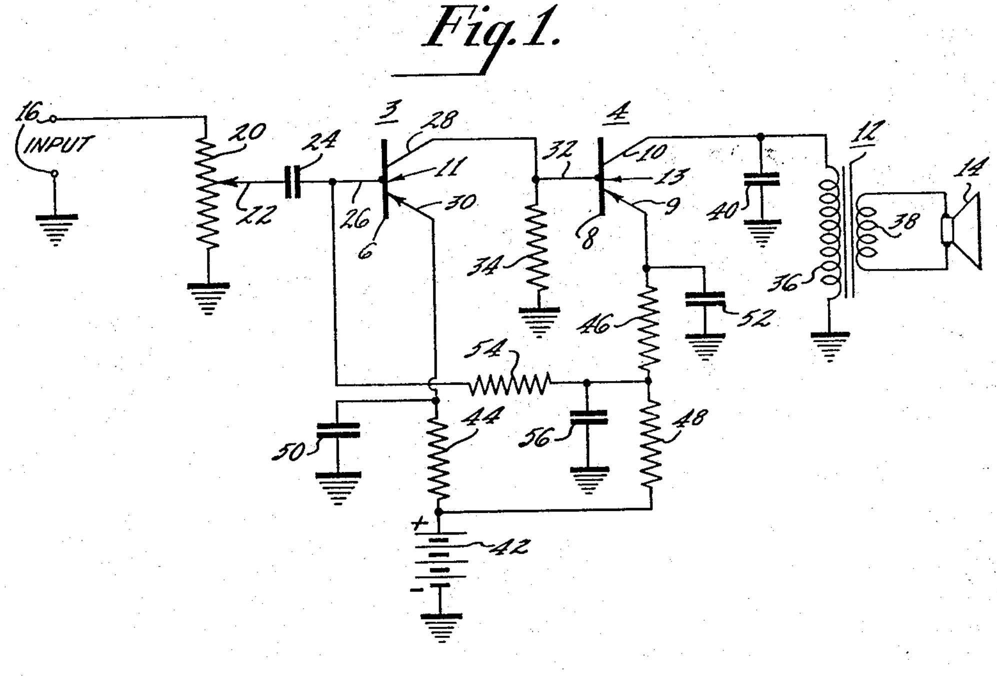

This invention relates in general to signal amplifying circuits and in particular to circuits of the type referred to employing semi-conductor devices connected in cascade relationship.

The recent development of commercially useful semi-conductor devices of the type employing a semi-conductive element having three contacting electrodes has already had a decided effect upon and has caused the introduction of many new techniques in the electronic signal communication field and more especially in that of electronic signal amplification. These devices, known extensively as "transistors," are small in size especially when compared with the ordinary vacuum tube, require no heater power, are very durable, and consist of materials which appear to have a long life.

Because of these advantages, extensive efforts have been made to permit the efficient utilization of transistors in signal amplifier and communication systems as above referred to. The transistor, while in many ways analogous to the vacuum or electronic tube, exhibits considerable and significant differences. Thus, in many instances, new techniques are needed for the most efficient application of the device in replacing or modifying known electronic tube systems, and this is of particular importance in the application of transistors in electronic-amplification circuits and systems of all types. Thus it has been found possible to directly connect transistors in cascade circuit relationship, thereby permitting the development of highly useful and efficient multi-stage transistor amplification units. Such systems exhibit sufficiently high gain and a signal-to-noise ratic which is acceptable for most applications.

More particularly, considerable research has been undertaken in the development of transistor amplification units suitable for use in radio signal receivers. Accordingly, the construction of superheterodyne radio receivers employing transistors in radio, intermediate and audio frequency amplifying units has been found feasible. The advantages of radio receivers employing transistors in one or more stages are readily apparent. Because of their comparatively small size transistors occupy relatively small space as compared to vacuum or electronic tubes.

In addition, the elimination of all or most of the heater supply equipment such as batteries or power units still further reduces the receiver space requirements which is of particular importance in portable equipment. Besides these advantages it is contemplated that radio receivers employing transistors may be considerably more durable or rugged than the conventional receivers utilizing vacuum tubes. This is a distinct advantage, especially where the receiver is of the portable type as referred to above, and subject to rather rough treatment. Because of their apparent long life, the replacement of transistors may be expected to be minimized. It has been found that these advantages may be attained without a reduction in performance qualities and give promise for greater improvements in the future.

Transistors normally are of two general classes which are known as the point-contact transistor and the junction transistor. Point contact transistors comprise, in general, a body of semi-conductive material, and three contacting electrodes which have been designated as the emitter electrode, the collector electrode and the base electrode. The semi-conductive body may be either of the N or P type. If the body is of the N type the emitter electrode is normally biased in a relatively conducting direction or positively, and the collector electrode in a relatively non-conducting direction or negatively with respect to the base electrode. If the body is of the P type the potentials are reversed.

The junction transistor on the other hand comprises, in general, a body of semi-conductive material having two zones of one conductivity type separated by a zone of the opposite conductivity type. Thus the device may be of either the N–P–N type or the P–N–P type. If the transistor is of the N–P–N type the emitter electrode is generally connected to the negative terminal of a source of potential and the collector electrode to a positive source, each with respect to the base electrode. For the P–N–P type these polarities are reversed.

A number of circuit arrangements have been proposed for connecting together individual transistors of both the point contact and junction type to produce multi-stage amplification systems. One of these circuit arrangements comprises two or more P–N–P or N–P–N junction type transistors connected in cascade relationship. In a more specific instance, a plurality of P–N–P transistors may have the emitter electrodes effectively connected to ground for signal frequencies and the collector electrodes biased in a non-conducting direction or negatively, with respect to the base electrode by means of a source of direct-current potential. The emitter electrode is biased positively and the input signal is, in this case, applied to each stage between the base electrode and the emitter electrode. Electrical connection between each transistor in the cascade circuit is made by connecting the collector electrode of one transistor to the base electrode of the succeeding transistor.

It has been found that in order to insure best operation of such devices, a forward bias should be applied between the emitter electrode and the base electrode of the transistor. To provide the required base electrode bias, a suitable resistor may be placed in the base electrode circuit of each transistor so that the direct-current flowing out of the base electrode may develop a suitable bias across the resistor. The aforementioned bias potentials determine the operating point of each transistor. Thus an increase in the base electrode current which results in an increased base-collector bias in the forward direction will increase the collector current if the collector electrode load impedance and the source of bias potential are kept constant.

In the ideal case, all electronic devices of one type should exhibit substantially identical operating characteristics. Practical experience has taught, however, that the achievement of this goal for most electronic equipment is not practically possible. Thus, for example, vacuum or electronic tubes of the same type may have different characteristics. In the same manner, individual transistors, although intended to have identical characteristics when manufactured, may differ from each other. Because of the non-uniform reproducibility of transistor characteristics identical operational results are not always attained where transistors are exchanged or replaced in a particular circuit arrangement. This fact introduces certain problems for which a solution has been sought.

Accordingly, in multi-stage amplifiers of the type hereinbefore referred to, the varying operating characteristics of individual transistors may require bias potentials which can be adjusted within limits. By providing a system having adjustable bias potentials adequate compensation may be made for varying transistor characteristics when replacing transistors in a circuit. However, unless a transistor having identical characteristics can be substituted for the original transistor, the bias requirements will be different.

The required change in bias may be effected by changing the potential derived from the direct-current source, which may be a battery, but this is inconvenient in most instances, particularly where individual transistors may be changed often. Because of the varying bias requirements of individual transistors and the disadvantages of changing bias potential sources, attempts have heretofore been made to devise means for insuring constant output current and uniform operation irrespective of the non-uniformity of the characteristics of individual transistors utilized in each amplification stage. Preferably such means would provide self-adjusting biases for the different transistor requirements. This invention is directed to circuit arrangements for achieving self-biasing for the transistors used in amplifier circuits to maintain desired bias currents and collector electrode currents of the output stage, regardless of change of transistors in the circuits.

It is, accordingly, a principal object of the present invention to provide an improved biasing arrangement in a circuit employing a plurality of semi-conductor devices for insuring a constant output current.

It is a further object of the present invention to provide an improved biasing arrangement in circuits employing semi-conductor devices connected in cascade relationship which is self-adjusting for different circuit components.

Still another object of the present invention is to provide an improved biasing arrangement in an amplifier circuit employing direct-coupled transistors for insuring a constant output current and which is self-adjusting for different circuit components.

These and further objects of the present invention are achieved by an improved amplifier circuit employing transistors, having means for establishing and controlling a self-biasing action for the transistors in accordance with their individual operating characteristics in the circuit, thus permitting interchange of transistors without the necessity of any change or alteration in the circuit arrangement.

Figure 2:
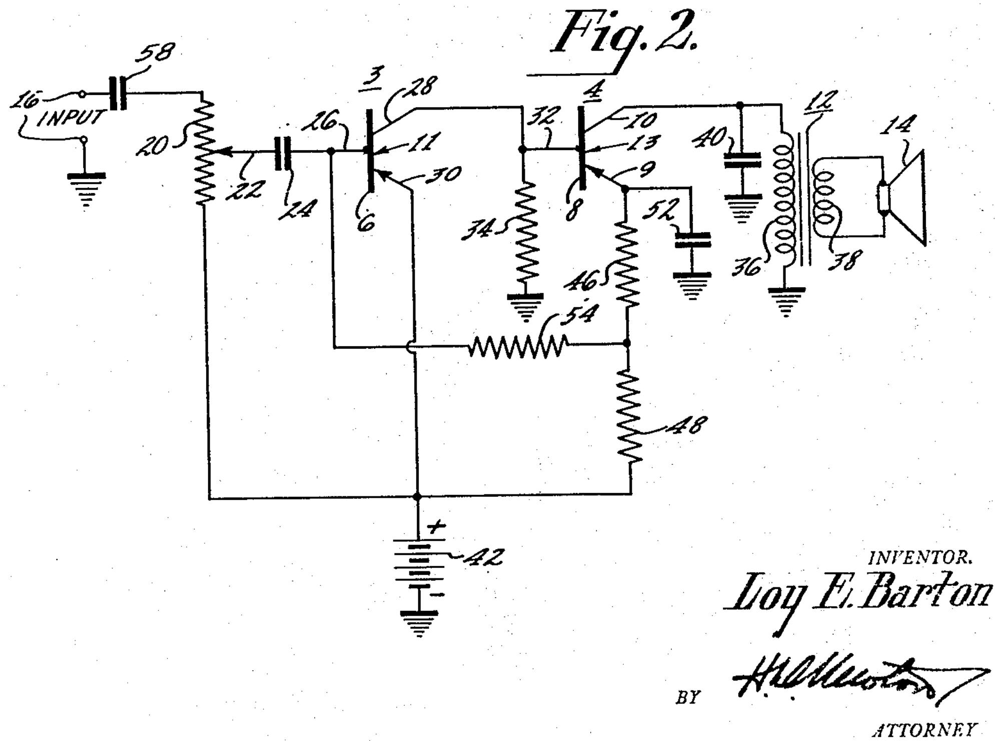

The novel features that are considered characteristic of this invention are set forth with particularity in the appended claims. The invention itself, however, both as to its organization and method of operation, as well as additional objects and advantages thereof, will best be understood from the following description when read in connection with the accompanying drawings, in which:

Fig. 1 is a circuit diagram of an audio-frequency amplifier embodying the present invention; and Fig. 2 is a modification of the circuit illustrated in Fig. 1, also embodying the present invention.

Referring now to the drawing, wherein like elements are designated by like reference numerals in both figures, and referring particularly to Fig. 1, a two stage transistor amplifier comprises a first amplifying stage 3 and a second amplifying stage 4. The amplifier may by a way of example, be the audio frequency amplifying section of a superheterodyne radio receiver, although it should be understood that the invention and its application are not restricted to an audio amplifier or a radio receiver. Each of the amplifying stages is provided with a semi-conductor amplifier device, comprising semi-conductive bodies 6 and 8 each having three contacting electrodes. Thus the body 6 has a base electrode 26, a collector electrode 28, and an emitter electrode 30, and the body 8 has a base electrode 32, a collector electrode 10, and an emitter electrode 9. These bodies and their electrodes will be referred to hereinafter as the driving transistor 11 and the output transistor 13.

The output transistor has its collector electrode 10 coupled through an output transformer 12 to a loud speaker 14 or other suitable sound reproducing means or utilization device. The driver and output transistors may be of the junction type and in the drawings are illustrated as being of the P–N–P junction type, although it should be understood that by reversing the biasing polarities an N–P–N type would work equally well.

The incoming signal when applied to input terminals 16, is impressed between the emitter electrode 30 and the base electrode 26 of the driver transistor 11. In order to provide volume control a potentiometer 20 having a variable tap 22 may be connected across the input terminals, as is conventional. The tap 22 is coupled through a coupling capacitor 24 to the base electrode 26 of the driving transistor 11. The collector electrode 28 of the driver transistor 11 is directly coupled to the base electrode 32 of the output transistor 13 with a relatively high resistance 34 connected between these electrodes and ground, for reasons which will hereinafter appear.

The amplified audio signals appearing in the collector electrode 10 of the output transistor 13 may be applied to a loud speaker 14. To provide a desired impedance matching condition for the low impedance load, an output transformer 12 may be included having a secondary winding 38 and a primary winding 36 connected between the collector electrode 10 and ground. A capacitor 40 may be included in the collector output circuit to provide a low impedance path to ground for undesired high frequency signals.

As mentioned above, the bias between the base electrode and the emitter electrode of each of the transistors 11 and 13 may be in a forward direction and the bias between the collector electrode and the base electrode may be in a reverse direction. To this end, the negative terminal of a battery 42 is connected to ground and its positive terminal is connected to the emitter electrodes of the transistors through appropriate resistors. Since each of the collector electrodes is provided with a direct current path to ground, the collector electrode of each transistor is biased negatively with respect to its emitter electrode. The emitter electrode 30 of the transistor 11 is connected through a resistor 44 to the positive terminal of the battery 42, and the emitter electrode 9 of the transistor 13 is connected through resistors 46 and 48 to the positive terminal of the battery. A resistor 54 is connected between the base electrode 26 of transistor 11 and the junction of resistors 46 and 48. In order to by-pass signal frequencies, by-pass capacitors 50, 52 and 56 are connected to ground across the resistors 44, 46 and 48 respectively.

As was previously explained, P–N–P junction transistors having base electrode input and a grounded emitter electrode are used by way of example in the specific application of the invention illustrated in the drawing. It is also known, as mentioned above, that bias between the base electrode and the emitter electrode may be in a forward direction or direction of easy current flow. To assist in achieving the proper base-emitter bias for the output transistor 13, in accordance with the invention, the resistor 34 is provided between the negative terminal of the source of potential 42, i. e. ground and a point on the lead connecting the collector electrode 28 of the driver transistor to the base electrode 32 of the output transistor and ground. This resistor serves the dual function of providing a current path for the driver collector electrode 28 and of assisting in establishing the proper bias for the base-emitter electrodes of the output transistor 13.

Further in accordance with the invention, a direct current feedback connection is provided by a resistor 54 connected between the junction of resistors 46 and 48 in the emitter circuit of the output transistor 13 and the base electrode 26 of the driver transistor 11. Thus any potential variations appearing across the resistor 48 due to a change in the average emitter current of the transistor 13 will vary the base electrode bias applied to the driver transistor 11. If for example, the potential across the resistor 48 is increased due to an increase in the emitter current of the transistor 13 the base electrode 26 of transistor 11 will become more negative with respect to the emitter electrode 30. This change in bias will lower the impedance between the emitter 30 and the collector 28, with the result that the collector current of the transistor 11 will increase.

As will further be discussed, this amplifier circuit provides for interchanging the transistors or the substitution of other transistors for the transistors originally inserted in the circuit without producing any appreciable change in the desired average direct current in the output circuit of the output stage. By connecting the circuit as illustrated, the bias potentials are made self-adjusting to compensate for any current variations introduced by the differing characteristics of individual transistors.

The self-biasing feature of the present invention will now be described, and in so doing it will be assumed that a static condition exists in the circuit, or in other words, there is no alternating current signal applied at the input terminals 16. The values of the resistors 34, 46 and 48 are so chosen that initially the base current drawn by the output transistor 13 is excessive, with the result that a larger current than is desired flows from the battery 42 through resistors 48 and 46, in the emitter electrode 9, out through the collector electrode 10, and through the primary winding 36 of the output transformer 12. At the same time this excessive base current will flow through resistor 34 to ground.

Because of the excessive current through resistor 48 an excessive bias in the forward direction will be applied between the base electrode 26 and the emitter electrode 30 of transistor 11. This excessive bias current causes excessive collector electrode current to flow through the resistor 34. This excessive collector electrode current through the resistor 34 produces a voltage drop across the resistor 34 causing the base electrode 32 to become more positive with respect to ground.

Accordingly, the forward bias between the base electrode 32 and the emitter electrode 9 is reduced, thereby reducing the base bias current. This change in potential at the base of transistor 13 results in a decrease of the base-emitter bias of the transistor 13 with the result that the current through resistors 46 and 48 and the primary winding 36 is reduced. This reduction in current through transistor 13 therefore reduces the voltage drop across resistor 48 with the result that the base-emitter bias potential of the transistor 11 is reduced.

The reduction of the base-emitter bias of the transistor 11 in turn causes a reduction in the collector electrode current of the transistor 11, thereby reducing the voltage drop across the resistor 34. This action continues and the final direct current in the output circuit of transistor 13 depends upon the values of the various resistors used in the circuit (primarily resistors 48 and 34). By a proper choice of the circuit elements a predetermined current condition is established in the output circuit. This current condition is substantially maintained irrespective of the characteristics of the individual transistors.

The resistor 44 in the emitter electrode circuit of the transistor 11 tends to stabilize the collector electrode current of the transistor 11. The voltage drop across resistor 48 should exceed the voltage drop across resistor 44 if a forward bias is to exist between the base and emitter electrodes of transistor 11. The circuit resistor 54 connection between the junction of resistors 46 and 48 and the base electrode 26 of transistor 11 forms a direct current path for the base electrode bias current of the transistor 11. The value of resistor 54 should be high compared to the input impedance of the transistor 11 but not sufficiently high to cause an excessive voltage drop due to the base electrode current of the transistor 11.

In the embodiment of the invention illustrated in Fig. 1, voltage variations appearing across the resistor 44 in the emitter electrode circuit of the driver transistor effectively oppose the voltage variations appearing across the resistor 48 in the emitter electrode circuit of the output transistor. Thus for a given voltage drop across the resistor 48, any increase in the voltage appearing in the emitter electrode circuit of the driver transistor decreases the driver transistor's collector electrode output current. It has been found that this resistor may in certain cases, be eliminated from the circuit without an appreciable effect on the operating characteristics. Furthermore, by eliminating the resistor 44 and connecting the battery 42 directly to the emitter electrode of the driver transistor, the by-pass capacitor 50 may also be eliminated from the circuit, all as shown in the embodiment of the invention illustrated in Fig. 2, to which attention is now directed. Since the resistor has been eliminated from the driver-emitter circuit there will be no voltage variations in this circuit to oppose the voltage variations across the resistor 48. Because of this, the resistor 48, in Fig. 2, may have a low resistance value as compared to its counterpart in Fig. 1. Since the resistance of resistor 48 is relatively low the by-pass capacitor for signal frequencies may also be eliminated from the feedback circuit.

The circuit illustrated in Fig. 2 essentially operates in a manner similar to that illustrated in Fig. 1. Thus an excessive bias in the base electrode of output transistor 4 increases the collector electrode current. This increased current increases the potential across the resistor 48 in the output transistor emitter circuit. This potential voltage makes the base electrode of the driver transistor more negative with respect to its emitter electrode. This in turn increases the collector current of the driver transistor which increases the voltage across resistor 34, thereby making the base 32 of the output transistor more positive and decreasing its collector current to the desired level. It is apparent, therefore, that the circuit illustrated in Fig. 2 like that in Fig. 1, provides means for insuring self-adjusting bias voltages irrespective of the characteristics of the particular transistors used. In addition, the circuit illustrated in Fig. 2 eliminates two capacitors and a resistor and a reduction in the size of the resistor 48 is possible.

While it will be understood that the circuit specifications of the invention may vary according to the design for any particular application, the following circuit specifications are included, by way of example only:

| | |
|---|---|
| Capacitor 24 | 10 microfarads. |
| Capacitor 40 | .005 microfarads. |
| Capacitor 50 | 25 microfarads. |
| Capacitor 52 | 25 microfarads. |
| Capacitor 56 | 25 microfarads. |
| Resistor 20 | 10,000 ohms. |
| Resistor 34 | 18,000 ohms. |
| Resistor 44 | 560 ohms. |
| Resistor 46 | 56 ohms. |
| Resistor 48 | 100 ohms (Figure 1).<br>25 ohms (Figure 2). |
| Resistor 54 | 5,600 ohms. |

A semi-conductor circuit employing semi-conductor devices connected in cascade relationship in accordance with the invention, provides means for adjusting the bias voltages automatially to compensate for varying characteristics of different semi-conductor devices, thus permitting a change of semi-conductors without changing the source of bias voltage. The circuit embodiments shown and described while of comparatively simple construction are stable and reliable in operation and adapted for many uses in accordance with the invention.

What is claimed is:

1. A semi-conductor signal amplifier circuit comprising a first and a second semi-conductor device, each having a semi-conductive body and a base electrode, a collector electrode, and an emitter electrode in contact therewith, means providing a source of potential for biasing said base and said emitter electrodes in a relatively conducting polarity and for biasing said base and collector electrodes in a relatively non-conducting polarity, a signal input circuit coupled between the base electrode and the emitter electrode of said first device, a signal output circuit coupled between the collector electrode and the emitter electrode of said second device, means providing a conductive connection and including a series impedance element coupling the emitter electrode of said first device to said source of potential, a second impedance element connected at one terminal with the collector electrode of said first device and the base electrode of said second device jointly and at the other terminal with said source of biasing potential, third and fourth impedance elements serially connected between the emitter electrode of said second device and said potential source, and feedback means coupling the junction of said third and fourth impedance elements to the base electrode of said first device whereby potential variations across said third impedance element are applied to the base electrode of said second semi-conductor device.

2. A semi-conductor signal amplifier circuit comprising a first and a second semi-conductor device, each having a semi-conductive body, and a base electrode, a collector electrode and an emitter electrode in contact therewith, energizing means including a source of potential for biasing said devices, a signal input circuit coupled between the base electrode and the emitter electrode of said first device, a signal output circuit coupled between the collector electrode and the emitter electrode of said second device, means providing a direct current conductive connection between the collector electrode of said first device and the base electrode of said second device, a first impedance element connected with the collector electrode of said first device and the base electrode of said second device and with said source of potential, means connecting the emitter electrode of said first device with said source of potential, a second and a third impedance element serially connected between the emitter electrode of said second device and said source of potential, and direct current conductive circuit means coupling the junction of said second and third impedance elements to the base electrode of said first device to apply potential variations across said second impedance element to the base electrode of said first semi-conductor device.

3. A semi-conductor signal amplifier circuit as defined in claim 2, wherein the second and third impedance elements are resistor devices, the third impedance element having a resistance larger than that of the second impedance element, and wherein the conductive circuit means coupling the junction of said second and third impedance elements to the base electrode of the first device includes a third resistor device.

4. A semi-conductor amplifier circuit comprising a first and a second semi-conductor device, each having a semi-conductive body and a base electrode, a collector electrode, and an emitter electrode in contact therewith, energizing means connected for applying energizing potentials to said transistors, means connecting said energizing means with the emitter electrode of said first device, impedance means connected in series between said energizing means and the emitter electrode of said second device, a signal input circuit coupled between the base and emitter electrodes of said first device, a signal output circuit coupled between the collector electrode and the emitter electrode of said second device, means providing a direct current conductive connection between the collector electrode of said first device and the base electrode of said second device and including an impedance element connected from the junction of the collector electrode of said first device and the base electrode of said second device to said energizing means, and feedback circuit means connected from an intermediate point of said impedance means and the emitter electrode of said second device to the base electrode of said first device to provide a direct current conductive connection therebetween whereby said second device is operative to control said first device through said feedback circuits.

5. A semi-conductor signal amplifier circuit comprising a first and a second semi-conductor device, each having a semi-conductive body and a base electrode, a collector electrode, and an emitter electrode in contact therewith, a source of potential for applying biasing potentials to said devices, a signal input circuit, signal conveying means coupling said input circuit between the base and emitter electrodes of said first device, a signal output circuit coupled between the collector and emitter electrodes of said second device, means providing a direct current conductive connection between the collector electrode of said first device and the base electrode of said second device, a common coupling resistor connected between said direct current conductive connection and said source of potential providing a reduction in the forward bias between the base and emitter electrodes of said second device in response to increased collector current flow of said first device, a pair of resistors connected in series between the emitter electrode of said second device and said source of potential, direct current conductive means connecting the emitter electrode of said first device with said source of potential, and conductive circuit means including a series resistance element coupling the junction of said pair of resistors to the base electrode of said first device to apply potential variations across one of said pair of resistors to the base electrode of said first semi-conductor device for controlling the operation of said amplifier circuit in response to changes in the operating characteristics of said semi-conductor devices.

6. A semi-conductor amplifier circuit comprising a first and a second semi-conductor device, each having a semi-conductive body and a base electrode, a collector electrode, and an emitter electrode in contact therewith, a signal input circuit coupled between the base and emitter electrodes of said first device and a signal output circuit coupled between the collector and emitter electrodes of said second device, means providing a point of fixed reference potential in said circuit, means providing a source of biasing potential connected with said point, first direct current conductive circuit means connecting the emitter electrode of said first device with said source, second direct current conductive circuit means including an impedance element connecting the emitter electrode of said second device with said source, common impedance coupling means, direct current conductively connecting the collector electrode of said first device and the base electrode of said second device with said point of fixed reference potential, and third direct current conductive circuit means connecting a point intermediate the impedance element of said second direct current conductive circuit means and the emitter electrode of said second device to the base electrode of said first device whereby said second device is operative to control said first device.

7. A semi-conductor signal amplifier circuit comprising a first and a second semi-conductor device each having a semi-conductive body and a base electrode, a collector electrode, and an emitter electrode in contact therewith, means providing a signal input circuit coupled between the base and emitter electrodes of said first device and an output circuit coupled between the collector and emitter electrodes of said second device, means including an impedance element providing variation in the base voltage of said second device in response to collector current variation of said first device and direct current conductive coupling between the collector electrode of said first device and the base electrode of said second device, circuit means for applying biasing potentials to said emitter electrodes including a first and a second resistor serially connected between the emitter electrode of said second device and a source of biasing potential, means connecting the emitter electrode of said first device with said source, and circuit means coupling the junction of said resistors to the base electrode of said first device for applying potential variations across said second resistor to the base electrode of said first semi-conductor device to mutually control and stabilize the operation of said devices.

8. A semi-conductor signal amplifier circuit comprising a first and a second semi-conductor device each having a semi-conductive body and an input electrode, an output electrode, and a common electrode in contact therewith, means including a source of potential for biasing said devices, direct current conductive means connecting the common electrode of said first device with said source of potential, means including a first impedance element providing a direct current conductive connection between the output electrode of said first device and the input electrode of said second device, said first impedance element being connected with the output electrode of said first device and the input electrode of said second device to vary the direct voltage on the input electrode of said second device in response to output current variation of said first device, a second and third impedance element serially connected between the common electrode of said second device and said source of potential, and feedback means coupling a point intermediate said second and third impedance elements to the input electrode of said first device to convey potential variations across said second element to the input electrode of said first semi-conductor device to control the operation of said amplifier circuit in response to changes in the operating characteristics of said semi-conductor devices.

9. In a system of the class described, the combination comprising a first and a second semi-conductor device each having a semi-conductive body and a base electrode, a collector electrode, and an emitter electrode in contact therewith, a source of potential for applying biasing potentials to said devices, a signal input circuit coupled between the base and emitter electrodes of said first device and a signal output circuit coupled between the collector and emitter electrodes of said second device, direct current conductive means connecting each of said emitter electrodes with said source of potential, said last named means including an impedance element connected between the emitter electrode of said second device and said source of potential, a resistor connected from the junction of the collector electrode of said first device and the base electrode of said second device to said source for varying the direct base voltage of said second device in response to variation in the direct collector current of said first device, and direct current conductive feedback circuit means coupling the junction of the emitter electrode of said second device and said impedance element to the base electrode of said first device whereby said second device is operative to control said first device through said feedback circuit.

References Cited in the file of this patent

UNITED STATES PATENTS

| | | |
|---|---|---|
| 2,531,076 | Moore | Nov. 21, 1950 |
| 2,541,322 | Barney | Feb. 13, 1951 |
| 2,666,817 | Raisbeck et al. | Jan. 19, 1954 |

OTHER REFERENCES

Bell text, "The Transistor," pages 342–344, 365, 184–185, pub. 1951 by Bell Tel. Labs., Inc.

Barton Abstract of App. S. N. 78,268, published Oct. 28, 1952, 663 O. G. 1220, 1221.